United States Patent [19]
Maeda et al.

[11] Patent Number: 4,872,042
[45] Date of Patent: Oct. 3, 1989

[54] SEMICONDUCTOR DEVICE

[75] Inventors: Satoshi Maeda, Yokohama; Hiroshi Iwai, Takaidonishi, both of Japan

[73] Assignee: Kabushiki Kaisha Toshiba, Kawasaki, Japan

[21] Appl. No.: 630,830

[22] Filed: Jul. 13, 1984

[30] Foreign Application Priority Data

Jul. 20, 1983 [JP] Japan .................................. 58-132601
Aug. 15, 1983 [JP] Japan .................................. 58-149058

[51] Int. Cl.$^4$ .......................................... H01L 29/78
[52] U.S. Cl. ...................................... 357/23.6; 357/41
[58] Field of Search .................... 357/23.13, 23.1, 23.6, 357/41

[56] References Cited

U.S. PATENT DOCUMENTS 3,447,046  5/1969  Cricchi et al. ........................ 357/42

OTHER PUBLICATIONS

IBM Technical Disclosure Bulletin vol. 10, #7, Dec. 1967, by McDowell p. 1032 "Use of MOS Substrate as Control Element".
*IBM Technical Disclosure Bulletin* vol. 15, #6, p. 1765 by Ho et al Nov. 1972.

*Primary Examiner*—Andrew J. James
*Assistant Examiner*—Mark Prenty
*Attorney, Agent, or Firm*—Finnegan, Henderson, Farabow, Garrett, & Dunner

[57] ABSTRACT

In a semiconductor device, a MOS transistor is formed in an island-like semiconductor region formed in a semiconductor substrate. The switching of the MOS transistor is controlled by changing a potential in the semiconductor region by means of a control circuit.

3 Claims, 7 Drawing Sheets

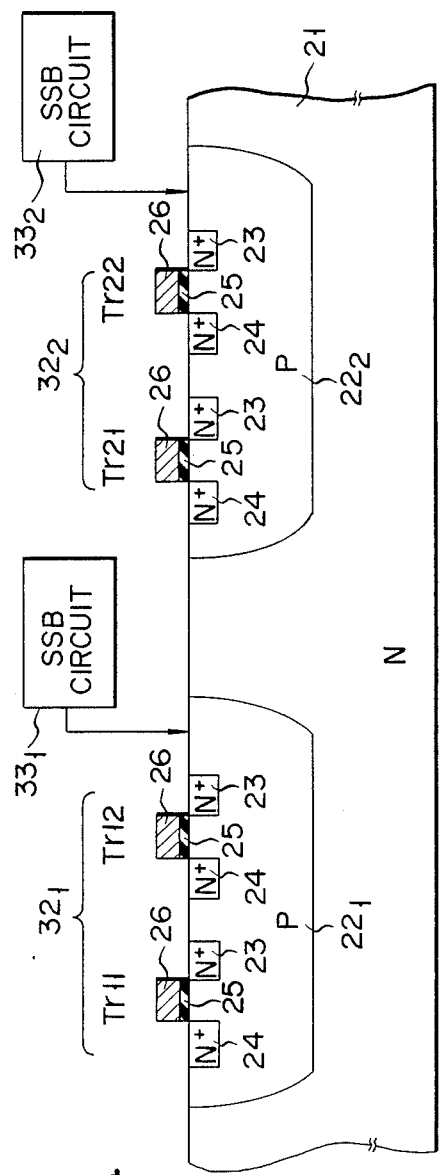
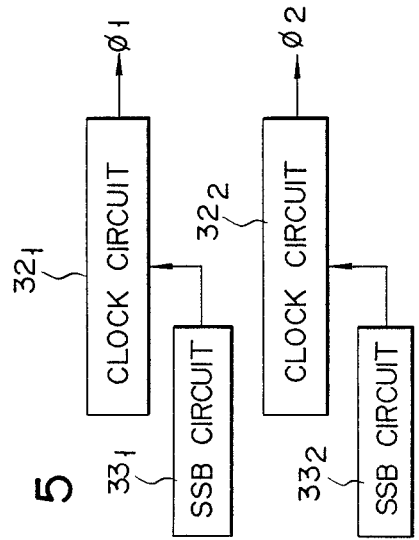
FIG. 4
FIG. 5
FIG. 6A
FIG. 6B

SEMICONDUCTOR DEVICE

BACKGROUND OF THE INVENTION

The present invention relates to a semiconductor device with a gate protecting function.

In a semiconductor device employing a MOS transistor for a switching element at the input/output section, switching is performed by changing the voltage at the gate. When the input/output section is formed of a MOS transistor, the gate of the MOS transistor is directly connected to the external terminal. Because of such a structure, if a large noise such as surge voltage is applied to the external terminal, the gate is often destroyed. To prevent the destruction of the gate, an input protection circuit is provided at the input terminal side for receiving an external input signal. This approach, however, is accompanied by a reduction in integration density and an increase in manufacturing cost.

A conventional dynamic RAM (random access memory) has a double layered electrode structure, as shown in FIG. 1. In FIG. 1, an island cell region 3 is formed on the major surface region of a P conductivity silicon substrate 1, while being isolated from other island cell regions (not shown). Formed on the cell region 3 is a thin oxide film 5. The oxide film 5 is in contact with the field oxide film 2. A capacitor electrode 4 made of polycrystal silicon, extending from the oxide film 5 to the field oxide film 2, is formed on the oxide film 5 and the field oxide film 2. An N− diffusion layer 6 is formed in a cell region 3 under the capacitor electrode 4. An N+ diffusion layer 7 is also formed in the cell region 3, while remaining separated at a predetermined distance from the N− diffusion layer 6. In the figure, reference numeral 8 designates a transfer gate electrode made of polycrystal silicon, for example. A gate electrode 8 is provided partially located in the cell region 3 between the N− diffusion layer 6 and the N+ diffusion layer 7 through a gate oxide film 9. The gate electrode 8 further partially covers an oxide film 10 layered over the capacitor electrode 4. An interlayer insulating film 11 is formed over the entire surface of the product including a transfer gate electrode 8. An Al (aluminum) interconnection 12 and another Al interconnection 13 are respectively formed through contact holes of the interlayer insulating film 11. The interconnection 12 is physically in contact with the capacitor electrode 4, and the interconnection 13 as a word line is physically in contact with the transfer gate electrode 8.

In the above-mentioned dynamic RAM, by applying voltage through the Al interconnection 13 to the transfer gate electrode 8, a charge transfer is caused between the N− diffusion layer 6 under the capacitor electrode 4 and the N+ diffusion layer 7. When an excessively large noise such as surge voltage is applied to the Al interconnection 13, the gate can be destroyed. A measure taken for protecting the gate from this large noise is the provision of an input protecting circuit on the Al interconnection side, as in the semiconductor device where the MOS transistor is provided in the input/output section. This measure, however, is still defective in that the addition of the input protecting circuit reduces integration density and increases the cost of the product.

The double layered electrode structure of the prior dynamic RAM increases the area of the cell region. This is one of the major hindrances in improving integration density. This structure naturally provides a very rugged surface which makes it difficult to form a micropattern. Furthermore, the prior semiconductor device requires the formation of two Al interconnection layers, one for the word line and the other for the bit line. This makes the circuit pattern more complicated.

SUMMARY OF THE INVENTION

Accordingly, an object of the present invention is to provide a semiconductor device which protects the gate from destruction caused by large noise, without using an input protection circuit.

According to the invention, there is provided a semiconductor device comprising:

a semiconductor area formed on a semiconductor substrate and an insulation layer;

a MOS transistor formed on the semiconductor area; and means for controlling the switching of said MOS transistor by changing a potential of the semiconductor area.

According to the invention, there is further provided a semiconductor device comprising:

a semiconductor substrate of a first conductivity type;

a semiconductor region of a second conductivity type selectively formed on a major surface of the substrate;

element separating regions formed in the semiconductor region;

island like cell regions defined and separated in a plane by the element separating region;

a thin insulating film formed on a surface region of the cell region;

electrodes each serving as a capacitor electrode and a transfer gate electrode, the electrodes being formed on the insulating film;

impurity layers of a first conductivity type of high concentration formed in the surface region of the cell region;

impurity material of a first conductivity type formed on most of the surface of each of the cell regions, the impurity material being separated a predetermined distance from the high concentration impurity layer; and means for controlling the switching of a MOS transfer transistor made of an impurity layer of low impurity and an insulating film electrode, by changing the potential of the semiconductor region.

BRIEF DESCRIPTION OF THE DRAWINGS

FIG. 4 structurally shows a semiconductor device which is another embodiment of the present invention;

FIG. 5 schematically illustrates the semiconductor device shown in FIG. 4;

FIGS. 6A and 6B respectively show waveforms of pulses produced by the semiconductor device shown in FIG. 4;

DETAILED DESCRIPTION OF THE PREFERRED EMBODIMENTS

A semiconductor device which is an embodiment of the present invention will be described referring to FIGS. 2 and 3.

Figure 2:
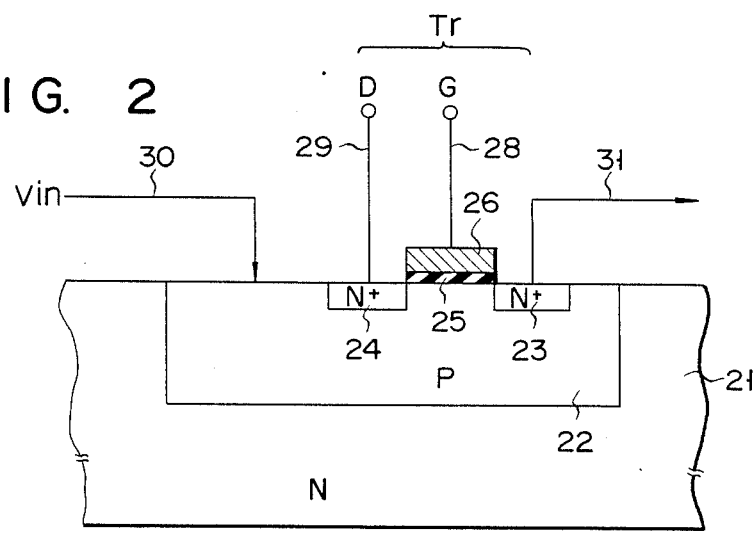
FIG. 2 structurally illustrates a semiconductor device including a MOS transistor which is an embodiment of the present invention.

FIG. 2 illustrates a semiconductor device formed of an N channel MOS transistor serving as a switching element. In FIG. 2, a P conductivity semiconductor layer, or a well 22, is formed in a silicon substrate 21 of an N conductivity type. Further formed within the P well 22 are an N+ type source region 23 and an N+ type drain region 24, which are electrically isolated from each other. A gate electrode 26 is provided above the P well 22 located between the source and drain regions 23 and 24 with a gate insulation film 25, for example, a SiO$_2$ film, being interposed therebetween. Such a structure forms an N channel MOS transistor Tr in the P well 22. The threshold voltage Vth of the transistor formed is 1.5 V, for example. The MOS transistor Tr may be an input transistor or an output transistor. Lines 28–31, respectively connected to the gate electrode 26, the drain region 24, the P well 22, and the source region 23, are representative of interconnection layers formed above the P well 22. The input line 30 is connected to a circuit for generating an input voltage Vin. The input voltage Vin for the P type well has a negative polarity, while that for the N type well has a positive polarity. In the figure, G and D are respectively representative of gate and drain terminals connected to the gate and drain lines 28 and 29. The line 30 connected to the P well 22 is an input interconnection wire, and the line 31 connected to the source region 23 is an output interconnection wire. The source line 31, as the output interconnection wire, is connected to an internal circuit (not shown) which is formed to extend from the source region 23 into the substrate 21.

The operation of the semiconductor device thus structured will now be described.

+5 V is applied to the drain region 24 from the drain terminal D through the drain line 29, and +1.5 V is applied from the gate terminal G through the gate line 28 to the gate electrode 26. Under this condition, the input voltage Vin of −5 V, for example, is applied to the P well 22, through the input line 30. In this case, a back gate bias effect caused by application of −5 V to the P well 22 pulls the threshold voltage Vth, for example from 1.5 V to 2.5 V. As a result, the MOS transistor Tr is OFF and logic "0" data is produced through the output line 31.

While keeping the above voltages applied to the drain region 24 and the gate electrode 26, the voltage Vin applied to the P well 22 is set at 0 V. Then, the MOS transistor Tr is turned on. Accordingly, logic "1" data is produced through the output line 31.

As described above, switching of the MOS transistor Tr may be controlled in such a manner that the voltage Vin is applied to the P well 22 and is appropriately changed while the voltage applied to the gate electrode 26 is kept constant. Therefore, even when a surge voltage is externally applied to the input terminal Vin, the surge voltage is shared not only by the capacitor of the MOS gate, but also by capacitors between the P well 22 and the substrate 21, between the P well 22 and the source region 24, and between the P well 22 and the drain region 23. Therefore, the gate destruction due to the surge voltage is prevented. This feature eliminates the need for providing an additional gate protecting circuit, and hence improves reliability and integration density of the semiconductor device.

Figure 3:
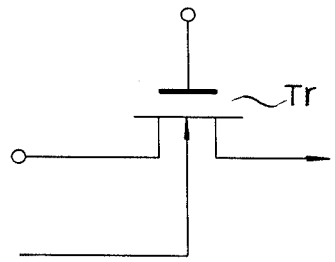
FIG. 3 schematically illustrates the semiconductor device shown in FIG. 2.

The semiconductor device thus arranged and operated may equivalently be expressed in an electric circuit representing an N channel MOS transistor, as shown in FIG. 3.

Turing now to FIG. 4, there is shown a second embodiment of a semiconductor device according to the present invention. As shown, a couple of wells are formed in the substrate 21, and each well has a MOS transistor formed therein. The MOS transistor in the well is controlled by a control voltage applied from an SSB (self-sub-bias) circuit associatively provided in the substrate.

Figure 1:
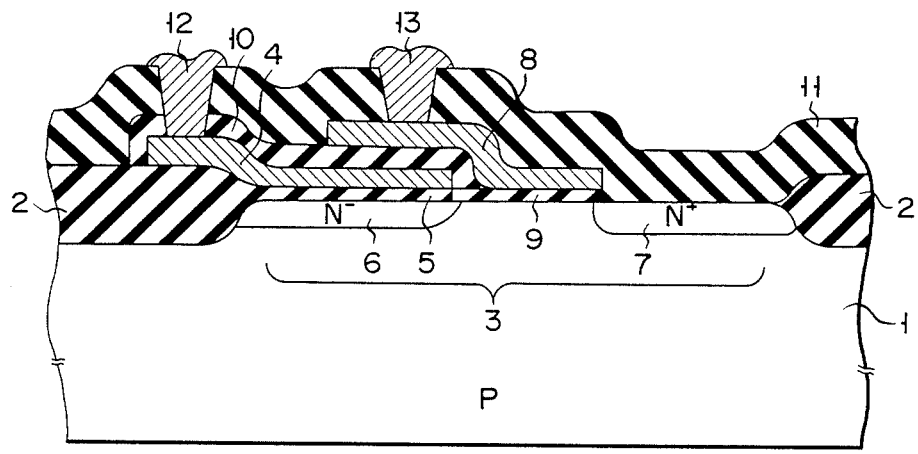
FIG. 1 shows a cross-sectional view of a prior dynamic RAM.

To be more specific, two P wells $22_1$ and $22_2$ are provided in the N type silicon substrate 21. MOS transistors Tr11, and Tr12 are respectively provided in the P well $22_1$. Similarly, two MOS transistors Tr21 and Tr22 are formed in the P well $22_2$. The structural arrangements of those MOS transistors Tr11, Tr12, Tr21 and Tr22 are each substantially the same as that of the MOS transistor Tr as mentioned above in the prior art description. Like reference numerals are used to designate like portions of the MOS transistor Tr in FIG. 1. First and second SSB circuits $33_1$ and $33_2$ are respectively provided in the transistor circuit $32_1$ formed in the P well $22_1$ and the transistor circuit $32_2$ in the P well $22_2$. The SSB circuits $33_1$ and $33_2$ are respectively connected to the P well regions $22_1$ and $22_2$. The SSB circuits $33_1$ and $33_2$ are respectively for applying sub-bias voltages to the P well regions $22_1$ and $22_2$. Upon receipt of the bias voltages from the SSB circuits $33_1$ and $33_2$, the transistor circuits $32_1$ and $32_2$ serve as clock circuits, respectively.

In this embodiment, if the bias voltage applied from the SSB circuit $33_1$ to the P well $22_1$ is 0 V, the threshold voltages of the MOS transistors Tr11 and Tr12 are low. Therefore, the current flowing into the MOS transistors Tr11 and Tr12 when those transistors are in an ON state is large, and hence the operation of the clock circuit $32_1$ is quickened. When the bias voltage applied from the SSB circuit $33_1$ to the P well $22_1$ is −1 V, the threshold voltage Vth increases. Therefore, the current flowing into the MOS transistors Tr11 and Tr12 when those transistors are in an ON state is small, and hence the operation of the clock circuit $32_1$ slows down. This implies that by selecting the bias voltages from the SSB circuits $33_1$ and $33_2$, the operation speed of the clock circuits $32_1$ and $32_2$ can be controlled.

If the bias voltage VssB1 of the first SSB circuit $33_1$ and the bias voltage VssB2 of the second SSB circuit $33_2$ are respectively set so that $|VssB1| < |VssB2|$, the output clock pulse $\phi1$ of the SSB circuit $33_1$ is generated prior to the generation of the clock pulse $\phi2$ from the second SSB circuit $33_2$ (see FIGS. 5 and 6A). Conversely, if those bias voltages are set so that $|VssB1| > |VssB2|$, the clock pulse $\phi2$ is generated prior to generation of the clock pulse $\phi1$, as shown in FIG. 6B. This fact implies that the generating order of the clock pulses $\phi1$ and $\phi2$ can be controlled by properly selecting the amplitude of the bias voltage VssB1 relative to that of the bias voltage VssB2, which is applied to the P wells $22_1$ and $22_2$. Therefore, in circuit design, no consideration need be made of the operation speed of the clock circuits $32_1$ and $32_2$, and the generation timing of the clock pulses $\phi1$ and $\phi2$. The result is a considerable reduction of design cost and manufacturing cost. In the FIG. 4 embodiment, the MOS transistors Tr11, Tr12, Tr21 and Tr22 each constitute a logic circuit, or a clock generating circuit.

Figure 7:
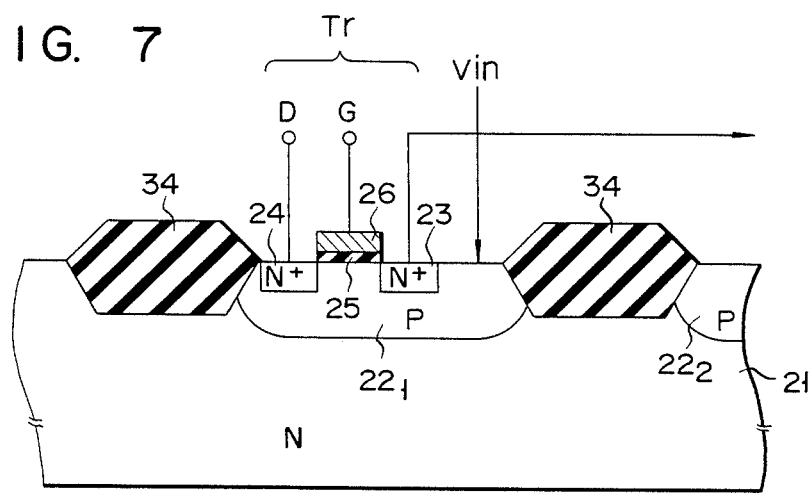
FIGS. 7 to 11 show other embodiments of the present invention, respectively.

FIG. 7 shows a third embodiment of the present invention. In this embodiment, the adjacent P wells $22_1$ and $22_2$ are separated from each other by a field oxide film 34. Formed within the P well $22_1$ is a MOS transistor Tr. The source 23 of the MOS transistor Tr is connected to a MOS transistor (not shown) formed in the P well $22_2$, and constitutes a circuit system. In this embodiment, when the potential Vin to the P well $22_1$ is set at 0 V, the MOS transistor Tr is turned on and provides a current output at the source region 23. The current output is applied to a MOS transistor (not shown) in the P well $22_2$. If the potential Vin to the P well $22_1$ is set at $-5$ V, the MOS transistor Tr is turned off, so that the current output at the source region 23 disappears. That is to say, no current is fed into the MOS transistor (not shown) in the P well $22_2$. Therefore, the operation of the circuit system can be controlled by controlling the potential Vin to the P well $22_1$. When the potential Vin of the P well $22_1$ is set at an appropriate value between the potential Vin to the P well $22_1$ and $-5$ V, the threshold voltage of the MOS transistor Tr is based on the selected potential. This fact implies that the MOS transistors formed in the P wells $22_1$ and $22_2$ may differ from each other in threshold voltage. In other words, the threshold voltage of the MOS transistors can properly be selected by controlling the potential Vin applied to the P well $22_1$, not by using a manufacturing technique such as ion implantation.

Figure 8:
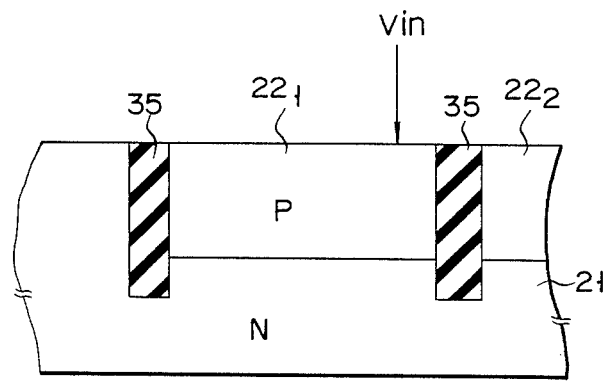

FIG. 8 shows a fourth embodiment of the present invention. In this embodiment, the adjacent P wells $22_1$ and $22_2$ are separated by a buried insulating film 35. The remaining structure is the same as that of FIG. 7. Therefore, no further explanation of the semiconductor device will be given. In the figure, the MOS transistors formed within the P wells $22_1$ and $22_2$ are omitted for simplicity of illustration.

Figure 9:
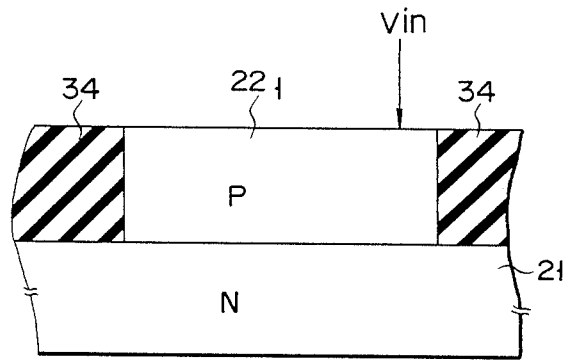

FIG. 9 shows a fifth embodiment of the present invention. In this embodiment, a P type epitaxial layer is grown on the N type silicon substrate 21. A field insulating film 34 is formed within the epitaxial layer. With this structure, the P wells $22_1$ and $22_2$ are separated from each other. In the drawing, a single P well $22_1$ is illustrated for simplicity.

Figure 10:
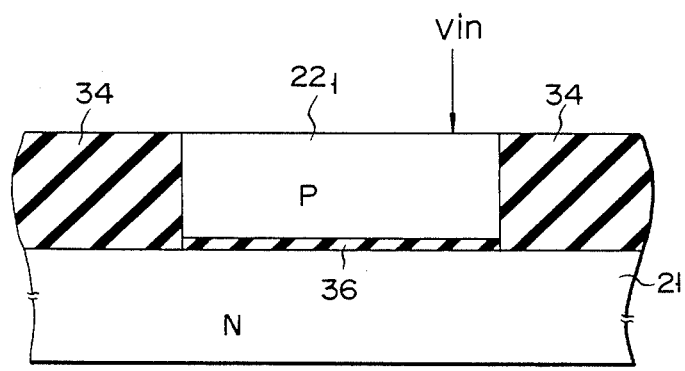

FIG. 10 shows a sixth embodiment of the present invention. This embodiment is similar to the fifth embodiment of FIG. 9, except that a thin oxide film 36 is formed on the substrate 21 and the P well $22_1$ is formed on the substrate 31 through the oxide film 36. For simplicity of illustration, the MOS transistor in the P well $22_1$ is omitted.

Figure 11:
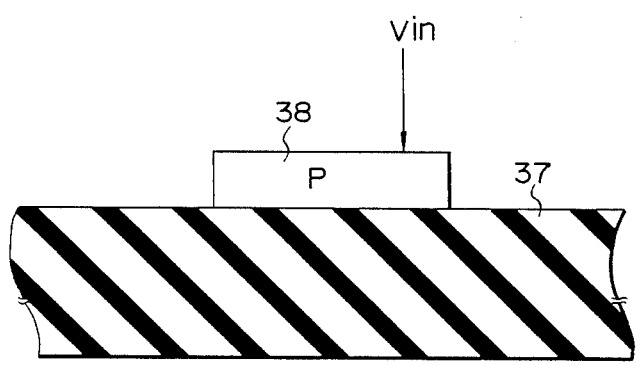

FIG. 11 shows a seventh embodiment of the present invention. In this embodiment, an island like P type semiconductor layer 38 is formed on a sapphire substrate 37 as an insulating substrate. The P type semiconductor layer 38 corresponds to the P wells 22, $22_1$, and $22_2$. Formed in this semiconductor layer 38 is an N channel MOS transistor. For simplicity of illustration, no MOS transistor is illustrated. Alternatively, an N type semiconductor layer is used in place of the P type semiconductor layer, and a P channel MOS transistor may be formed therein.

Figure 12A:
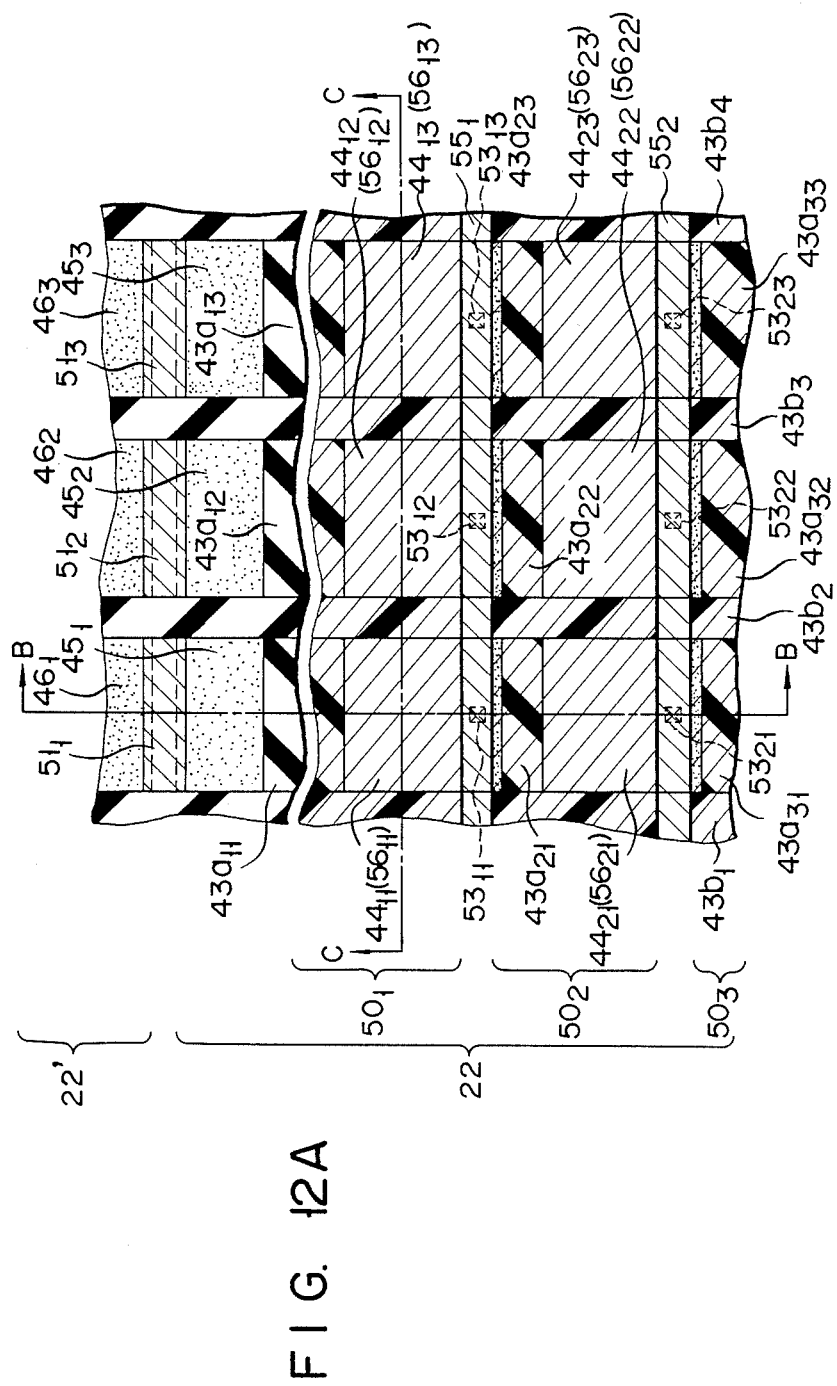
FIG. 12A shows a plan view of memory cells of a dynamic RAM which is a further embodiment of the present invention.
Figure 12B:
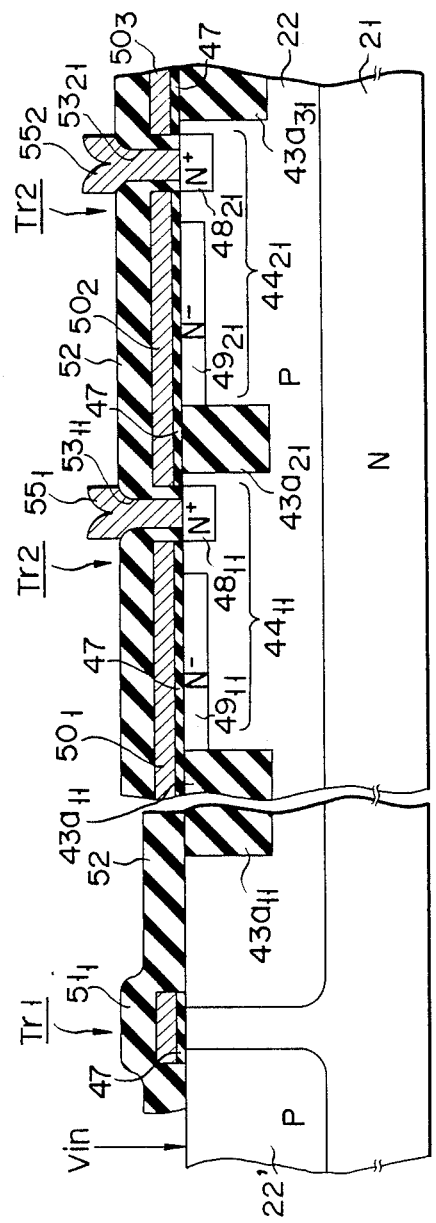
FIGS. 12B and 12C are respectively enlarged cross-sectional views taken on lines B—B and C—C in FIG. 12A.
Figure 12C:
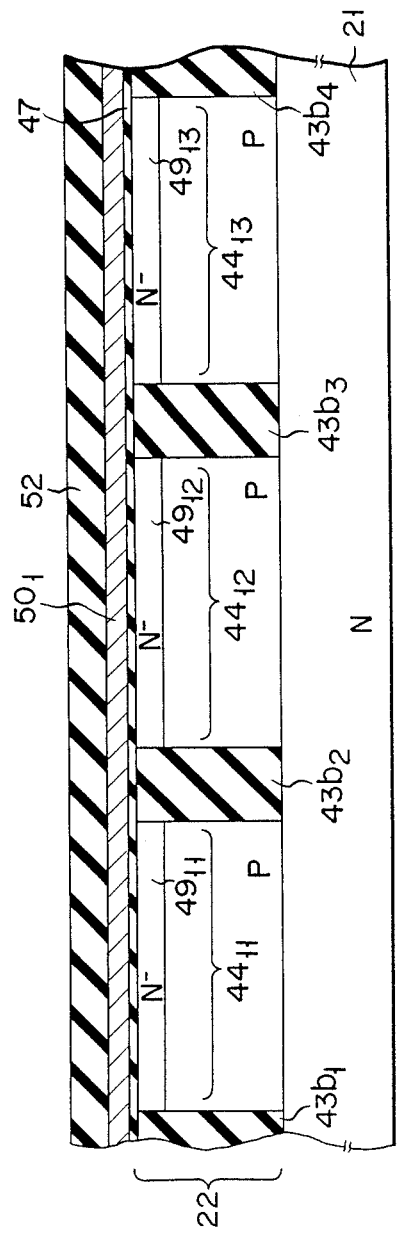

FIGS. 12A–12C show an eighth embodiment of the present invention. In this embodiment, the present invention is applied to a dynamic RAM (random access memory).

A couple of P wells 22 and 22' are formed in the N type silicon substrate 21. Formed within the P well 22 are element separating regions $43a_{11}$–$43a_{13}$, $43a_{21}$–$43a_{23}$, $43a_{31}$–$43a_{33}$ ... formed of buried SiO2 and extending in the row or X direction, and regions $43b_1$, $43b_2$, $43b_3$ ... formed of buried SiO2 and extending in the column or Y direction. As seen from top, a plurality of island RAM cell regions $44_{11}$, $44_{12}$, $44_{13}$, $44_{21}$, $44_{22}$, and $44_{23}$ is formed in the P well, which are separated by these element separating regions in the X and Y directions. As shown in FIG. 12B, the X direction separating regions $43a_{11}$–$43a_{33}$ ... terminate above the bottom surface of the P well 22 (the boundary between the P well 22 and the substrate 21), as viewed in the drawing. The Y direction separating regions $43b_1$, $43b_2$ ... reach the bottom surface of the P well 22, as shown in FIG. 12C. Therefore, the cell regions arrayed on the same column line provide common regions. Specifically, the cell regions $44_{11}$ and $44_{21}$ provide a common region; the cell regions $44_{12}$ and $44_{22}$ provide another common region; the cell regions $44_{13}$ and $44_{23}$ provide yet another common region. The cell regions arrayed in the same column line are electrically separated from one another. Arrayed on one side of the P well 22 are island regions $45_1$, $45_2$, $45_3$ ... physically separated from one another as viewed from above. Those island regions are electrically isolated from each other by the Y direction insulating layers $43b_2$, $43b_3$ ... The island region $45_1$, together with the cell regions $44_{11}$ and $44_{21}$, forms a common region in the Y or column direction. The island region $45_2$, together with the cell regions $44_{12}$ and $44_{22}$, forms a common region in the row or X direction.

The separating regions $23b_1$, $23b_2$ ... arrayed extending in the column direction enter into another P well 22'. Accordingly, the P well 22', as viewed from above, has an array of island regions $46_1$, $46_2$, and $46_3$ which are electrically isolated from one another.

An oxide film 47 is selectively formed on the cell regions $44_{11}$–$44_{13}$, $44_{21}$–$44_{23}$, and on the X and Y direction separating regions $43a_{11}$–$43a_{33}$ ... $43b_1$–$43b_4$, $44_{21}$–$44_{23}$. The oxide film 47 is also formed on the substrate 21 between the P wells 22 and 22'. Impurity diffusion layers $48_{11}$–$48_{13}$ and $48_{21}$–$48_{23}$ of N+ conductivity type are respectively formed in the cell regions $44_{11}$–$44_{13}$ and $44_{21}$–$44_{23}$. In FIG. 12B, only two impurity diffusion layers $48_{11}$ and $48_{12}$ are illustrated for simplicity. The ends of the diffusion layer $48_{11}$ as viewed in the row direction are in contact with the separating regions $43b_1$ and $43b_2$ extending in the column direction. This is true for the remaining diffusion layers $48_{12}$, $48_{13}$, $48_{21}$–$48_{23}$. N− diffusion layers $49_{11}$–$49_{13}$ and $49_{21}$–$49_{23}$ are each formed on most of the area of each of the cell regions $44_{11}$–$44_{13}$ and $44_{21}$–$44_{23}$, while being separated by a predetermined distance from the N+ diffusion layers $48_{11}$–$48_{13}$ and $48_{21}$–$48_{23}$. For simplicity, only two diffusion layers $49_{11}$ and $49_{12}$ are illustrated. The ends of these diffusion layers as viewed in the row direction are in contact with the separating regions $23b_1$ and $23b_2$ arranged to extend in the column direction. This is true for the remaining diffusion layers $48_{12}$, $48_{13}$, and $48_{21}$–$48_{23}$. One side of the diffusion layer $48_{11}$ extending in the row direction is in contact with the separating region $43a_{11}$ extending in the row direction. This is true for the remaining diffusion layers $48_{12}$, $48_{13}$, $49_{21}$–$48_{23}$. An electrode layer $50_1$ made of polysilicon, serving as a capacitor electrode and a transfer gate, is formed through an oxide film 47 on the cell regions $44_{11}$–$44_{13}$ and the separating regions $43a_{11}$–$43a_{13}$. An electrode layer $50_2$ made of polysilicon, for example, serving as a capacitor electrode and a transfer gate, is formed through an oxide film 47 on the cell regions $43a_{21}$–$44a_{23}$ and the separating regions $43a_{21}$–$43a_{23}$ The regions of the electrode layer $50_1$, which correspond to the N− diffusion layers $49_{11}$–$49_{13}$, serve respectively as capacitor electrodes. The regions corresponding to the region between the N− diffusion layer $49_{11}$ and N+ diffusion layer $48_{11}$, serve as a transfer gate electrode. Similarly, in the electrode layer $50_2$, the regions corresponding to the diffusion layers $49_{21}$–$49_{23}$ serve respectively as capacitor electrodes. The regions of the electrode layer $50_2$ corresponding to the regions between the N− diffusion layer $49_{21}$ and the N+ diffusion layer $48_{21}$, between the diffusion layers $49_{22}$ and $48_{22}$, and between the diffusion layers $49_{23}$ and $48_{23}$, serve as transfer gate electrodes, respectively. Formed on the region of the oxide film 47, corresponding to the region of the substrate 21 between the island region $45_1$ of the P well 22 and the island region $46_1$ of the P well 22′, is a gate electrode layer $51_1$ made of polysilicon, for example, which is fabricated in the same manufacturing step as that of the electrodes $50_1$ and $50_2$. Similarly, a gate electrode layer $51_2$ is formed on the region of the oxide film 47 corresponding to the region of the substrate 21 between the island region $45_2$ of the P well 22 and the island region $46_2$ of the P well 22′. Further, a gate electrode $51_3$ is formed on the region of the oxide film 47 corresponding to the region of the substrate 21 between the island region $45_3$ of the P well 22 and the island region $46_3$ in the P well 22′. The electrode layers $51_2$ and $51_3$, like the electrode layer $51_1$, are manufactured in the same step as that of the electrodes $50_1$ and $50_2$. These electrode layers are made of polysilicon, for example. The electrode layers $50_1$–$50_3$ are connected to the word line WL (not shown).

An interlayer insulating film 52 made of $SiO_2$ is formed on the major surface of the structure containing the electrodes $50_1$ and $50_2$, and the gate electrode layers $51_1$–$51_3$. Contact holes $53_{11}$–$53_{13}$ and $53_{21}$–$53_{23}$ are respectively formed in the oxide film 47 and the interlayer insulating film 52, while being above and communicating with the N+ diffusion layers $48_{11}$–$48_{13}$ and $48_{21}$–$48_{23}$ An aluminum (Al) interconnection layer (bit line) $55_1$ is formed on the interlayer insulating film 52, which connects through the contact holes $53_{11}$–$53_{13}$ respectively to the N+ diffusion layers $48_{11}$–$48_{13}$. The interconnection wire $55_1$ extends in the row direction. Similarly, formed in the interlayer insulating film 52 is an Al interconnection layer $55_2$ connecting through contact holes $53_{21}$–$53_{23}$ respectively to N+ diffusion layers $48_{21}$–$48_{23}$. The interconnection wire $55_2$ extends in the column direction. The electrodes $50_1$ and $50_2$ are connected to a constant voltage $V_{DD}$. The P well 22′ is connected to an external power voltage Vcc.

In this way, memory cells $56_{11}$–$56_{13}$ and $56_{21}$–$56_{23}$ are respectively formed in the memory cell regions $44_{11}$–$44_{13}$ and $44_{21}$–$44_{23}$.

Figure 13:
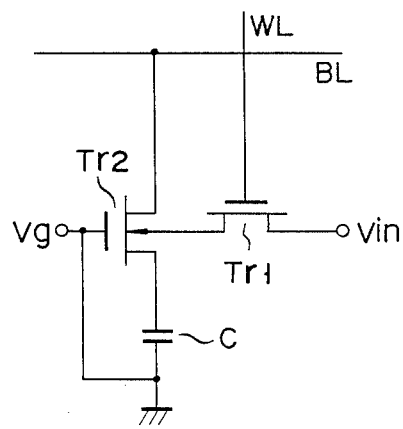
FIG. 13 schematically shows an equivalent circuit of the embodiment shown in FIGS. 12A-12C.

One of the memory cells is equivalently illustrated in FIG. 13. This equivalent circuit contains a transistor formed between the P wells 22 and 22′. A MOS transistor Tr1 is structured of, for example, a combination of the N+ diffusion layer $48_{11}$, the N− diffusion layer $49_{11}$, the insulating film 47, and the electrode layer $50_1$ A capacitor C is structured of, for example, a combination of the electrode layer $50_1$, the N− diffusion layer $49_{11}$, and the portion of the oxide film 47 sandwiched by these layers. A MOS transistor Tr2 is structured of, for example, a combination of the P wells 22 and 22′, the oxide film 47 and the gate electrode $51_1$.

One end of the drain-source path of the transistor Tr2 is connected to ground through the capacitor C, while the other end is connected to the bit line BL. The gate of the transistor Tr2 and the terminal of the capacitor C closer to the transistor Tr2 are connected to a constant voltage Vg. One end of the drain-source path of the transistor Tr1 is connected to the substrate of the transistor Tr2, while the other end is connected to the external voltage Vin for back gate bias. The gate of the transistor Tr1 is connected to the word line WL.

The operation of the dynamic RAM shown in FIGS. 12A–12C will be described. 1.5 V, for example, as the constant voltage $V_{DD}$ is applied to the electrode layers $50_1$, $50_2$... A predetermined voltage is applied through the bit line $55_1$ (Al interconnection wire) to the N+ diffusion layers $48_{11}$–$48_{13}$, and through the bit line $55_2$ (Al interconnection wire) to the N+ diffusion layers $48_{21}$–$48_{23}$. Under this condition, −5 V, for example, as the external voltage Vcc, is applied to the respective island regions $46_1$–$46_3$ in the P well 22′. Then, by an address signal, the gate electrode of the MOS transistor Tr2 is energized through the word line WL. As a result, −5 V is applied to the cell regions $44_{11}$ and $44_{21}$ through the island region $45_1$. In this case, no voltage is applied to the remaining island regions $45_2$ and $45_3$ and the cell regions $44_{12}$, $44_{13}$, $44_{22}$ and $44_{23}$ because these regions are insulated from the island region $45_1$ and the cell regions $44_{11}$ and $44_{21}$. When −5 V is applied to the cell regions $44_{11}$ and $44_{21}$, the threshold voltage of the MOS transistors in the cell regions $44_{11}$ and $44_{21}$ is increased and turned off. As recalled, these transistors are respectively an MOS transistor structured of an N− diffusion layer $49_{11}$, an N+ diffusion layer $48_{11}$, an oxide film 47, a portion of an electrode $50_1$ on the P well 22 between these diffusion layers, and another MOS transistor structured of an N− diffusion layer $49_{21}$, an N+ diffusion layer $48_{21}$, an oxide film 47, and a portion of the electrode $50_2$ on the P well 22 between these diffusion layers. Since voltage applied to the other cell regions $44_{12}$, $44_{13}$, $44_{22}$ and $44_{23}$ is at 0 V, the MOS transistors in those cell regions are turned on.

Non-select, data write and data read modes of the dynamic RAM will be described in this order.

(1) Non-Select Mode:

An external voltage Vin of −5 V is applied to the island regions $46_1$–$46_3$ in the P well 22′, and a voltage of 1.5 V is applied to the electrodes $50_1$, $50_2$... Under this condition, the MOS transistors Tr2 with the gate electrodes $51_1$–$51_3$ are turned on. Accordingly, −5 V is applied to all of the cell regions $44_{11}$–$44_{13}$ and $44_{21}$–$44_{23}$, thereby turning off the MOS transistors Tr1 in those memory cells. In this way, all of the memory cells are placed in a non-select mode.

(2) Data Write Mode:

In this mode, the voltage Vin of −5 V is applied to the P well 22′ and the voltage of 1.5 V is applied to the electrodes $50_1$, $50_2$... as in the non-select mode. At the same time, the bit line (BL), for example, $55_1$, is supplied with +5 V and selected, and a predetermined voltage is applied to the N+ diffusion layers $48_{11}$–$48_{13}$ of the memory cells $56_{11}$–$56_{13}$. Under this condition, the address signal is applied to the gate electrodes $51_1$, $51_2$ . . . through the word lines WL, thereby turning off the MOS transistor Tr2 with the gate electrode $51_1$. As a result, the cell regions $44_{11}$ and $44_{21}$ have 0 V, and the memory cell $56_{11}$ is addressed. Then, the MOS transistor Tr1 of the memory cell selected is turned on and the capacitor C is charged. In this way, data is written into the memory cell $56_{11}$. Subsequently, the transistor with the gate electrode $51_1$ is turned on, and the transistor Tr1 in the memory cell $56_{11}$ is turned off.

(3) Data Read Mode:

The voltage applied to the word line $51_1$ is set at 0 V, and the MOS transistor Tr1 is turned off. The voltage Vin applied to the island regions $46_1$–$46_3$ in the P well $22'$ is set at 0 V and the MOS transistors Tr2 are turned on. The voltage applied to the electrodes $50_1$, $50_2$, . . . is kept at 1.5 V, as in the write mode.

In this state, +5 V voltage is applied to the bit line, for example, line $55_1$. Therefore, data stored in the capacitor C in the cell region $44_{11}$ is read out to the bit line $55_1$. Specifically, when the capacitor C stores no charge (i.e. logic data is "1"), the potential at the bit lines $55_1$ is kept at 5 V. When the capacitor C stores charges (i.e. logic data is "0"), the potential at the bit line $55_1$ decreases to 4.5 V, for example.

In the semiconductor chip, a dummy cell is provided whose potential is set at the middle potential (i.e. 4.75 V) between 4.5 V and 5 V. In the semiconductor chip, there is also provided a sense amplifier (not shown). The sense amplifier compares the potential at the bit line $55_1$ and the potential at the dummy cell. The amplifier outputs logic data "1" when the potential at the bit line $55_1$ is higher than that of the dummy cell. The amplifier outputs logic data "0" when the potential at the bit line $55_1$ is lower than that of the dummy cell. In this way, data is read out.

As seen from the foregoing description, according to the present invention, the switching of the MOS transfer transistor, with the fixed voltage applied to the electrode serving as both the MOS transfer gate electrode and the capacitor electrode, can be controlled by appropriately changing the voltage applied to the well. With this feature, when large noise such as surge voltage is superposed on the input voltage, the noise is shared by the capacitor of the MOS transistor, the capacitor of the well and the substrate, the capacitor between the N$^-$ diffusion layer and the well, and the capacitor between the N$^+$ diffusion layer and the well. Therefore, the destruction of the gate is prevented. In this respect, an improvement of a dynamic RAM that is reliable and that has high integration density is attained.

In the prior dynamic RAM, the capacitor electrode and the transfer gate electrode are separately double layered. On the other hand, in the dynamic RAM shown in FIGS. 12A–12C, a single common electrode has the functions of both the electrodes. The common electrode has a single layer structure. Therefore, the surface of the pattern structure is good in flatness, thus realizing a microfabrication of the circuit pattern. The flatness of the pattern structure reduces the rugged or stepwise portions on the surface, resulting in an improved reliability and a higher production yield. Further, the common electrode for the capacitor electrode and the transfer gate electrode remarkably reduces the areas occupied by the cell regions, leading to a remarkable improvement of the integration density.

In the respective embodiments as mentioned above, the N substrate 21 may be of a high concentration type. In such a case, the latch-up phenomenon innate to the CMOS transistors may be prevented.

Figure 14:
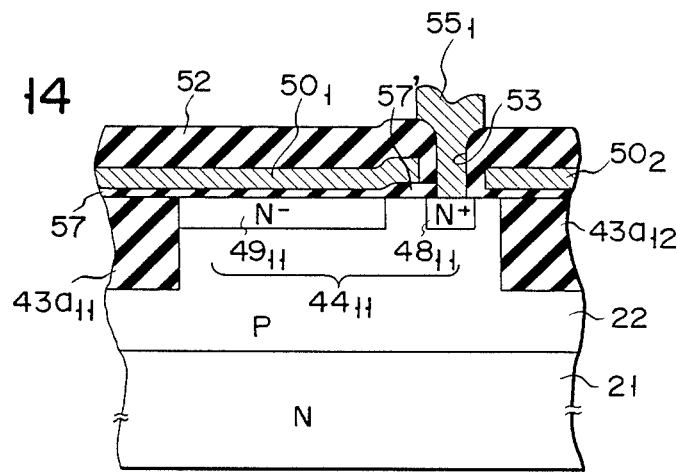
FIGS. 14 and 15 partially show other embodiments of the present invention.
Figure 15:
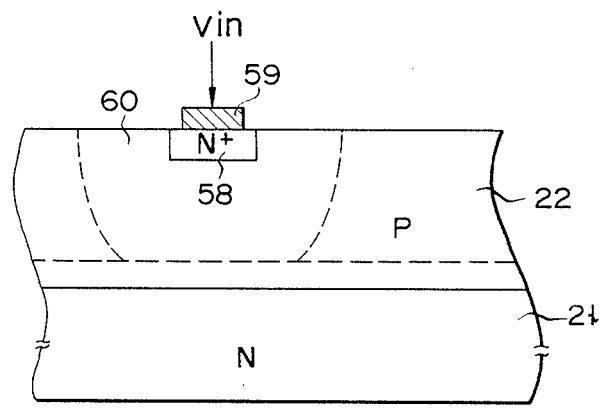

In the above-mentioned embodiments, the oxide film of a fixed thickness is provided under the electrode serving as both the capacitor electrode and the transfer gate electrode. This structure, however, may be modified into a structure as shown in FIG. 14. In this figure, a thin oxide film 57 is provided under the region of the electrode $50_1$ which serves as the transfer gate electrode. An oxide film $57'$ thicker than the film 57 is provided under the region of the electrode $50_1$ which serves as the transfer gate electrode. This structure increases the capacitance of the capacitor for charge storage, and improves the reliability of the MOS transfer transistor.

In the above-mentioned embodiments, the bit line connected to the N$^+$ diffusion layer is formed of Al interconnection wire, but this may be made of polycrystal silicon. When the polycrystal silicon is used, it may be manufactured together with the electrode in the manufacturing step of electrode formation. In this case, the flatness of the structure surface is further improved.

In the above-mentioned embodiments, the application of voltage to the P well is controlled by using the transistor of the MOS structure. Alternatively, the voltage application may be controlled by properly controlling a depletion layer 60 of a MOSFET formed of an N$^+$ junction region 58 formed in the surface region of the end portion of the P well 22 and by controlling a gate electrode 59 formed on the junction region 58.

It should be understood that the present invention may variously be changed and modified within the scope of the present invention.

As seen from the foregoing description, the semiconductor device according to the present invention can protect the gate from destruction caused by a loud noise such as a surge voltage, and is improved in reliability and integration density.

What is claimed is:

1. A semiconductor device comprising:
   a semiconductor substrate of a first conductivity type;
   a semiconductor well of a second conductivity type formed in said semiconductor substrate;
   an insulation film formed on said semiconductor well, said insulation film having a predetermined pattern for defining a plurality of element regions in said semiconductor well;
   a first high impurity concentration semiconductor region of said first conductivity type formed in each of said element regions;
   a second low impurity concentration semiconductor region of said first conductivity type formed in each of said element regions, said second low impurity concentration semiconductor region being separated from said first high impurity concentration semiconductor region by a predetermined distance;
   a thin insulation film formed on each of said element regions;
   an electrode formed on a first portion of said thin insulation film laying above said second low impurity concentration semiconductor region in each of said element regions and formed on a second portion in each of said element regions which is between said first high impurity concentration semiconductor region and said second low impurity concentration semiconductor region, said electrode, said first high impurity concentration semiconductor region, said second low impurity concentration semiconductor region and said thin insulation film forming a MOS transistor in each of said semiconductor regions, one portion of said electrode laying above said second low impurity concentration semiconductor region forming a capacitor electrode of each of said MOS transistors, and another portion of said electrode formed on said second portion forming a gate electrode of each of said MOS transistors; and means for controlling the switching of each of said MOS transistors by changing a potential of said semiconductor well.

2. A semiconductor device according to claim 1, wherein said element regions are arrayed in a matrix, a first plurality of said element regions arranged in a row and being connected in common in said semiconductor layer.

3. A semiconductor device according to claim 2, wherein a second plurality of said element regions are arranged in a column and connected in common in said semiconductor layer.

* * * * *